United States Patent
Yu et al.

(10) Patent No.: US 10,515,800 B2
(45) Date of Patent: Dec. 24, 2019

(54) SOLID PHASE CRYSTALLIZATION METHOD AND MANUFACTURING METHOD OF LOW-TEMPERATURE POLY-SILICON TFT SUBSTRATE

(71) Applicant: Wuhan China Star Optoelectronics Semiconductor Display Technology Co., Ltd., Wuhan, Hubei (CN)

(72) Inventors: Lei Yu, Hubei (CN); Songshan Li, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/773,690

(22) PCT Filed: Feb. 22, 2018

(86) PCT No.: PCT/CN2018/076942
§ 371 (c)(1),
(2) Date: May 4, 2018

(87) PCT Pub. No.: WO2019/144451
PCT Pub. Date: Aug. 1, 2019

(65) Prior Publication Data
US 2019/0228968 A1    Jul. 25, 2019

(30) Foreign Application Priority Data

Jan. 23, 2018  (CN) .......................... 2018 1 0065170

(51) Int. Cl.
*H01L 21/02* (2006.01)
*H01L 29/66* (2006.01)

(52) U.S. Cl.
CPC .. *H01L 21/02667* (2013.01); *H01L 21/02532* (2013.01); *H01L 21/02595* (2013.01); *H01L 29/66757* (2013.01); *H01L 21/02592* (2013.01)

(58) Field of Classification Search
None
See application file for complete search history.

(56) References Cited

U.S. PATENT DOCUMENTS 6,235,563 B1 *  5/2001  Oka .................... H01L 21/2022
                                                        438/166
2002/0197742 A1  12/2002  Kamins
(Continued)

FOREIGN PATENT DOCUMENTS

| CN | 102629558 A | 8/2012 |
| CN | 102732941 A | 10/2012 |

(Continued)

*Primary Examiner* — Moazzam Hossain
*Assistant Examiner* — Stanetta D Isaac
(74) *Attorney, Agent, or Firm* — Leong C. Lei (57) ABSTRACT

A solid phase crystallization method of the present invention includes: providing amorphous silicon; heating the amorphous silicon to a first crystallization temperature; continuously heating the amorphous silicon to cause a temperature rise, in a first time period, from the first crystallization temperature to a second crystallization temperature, keeping the amorphous silicon in the second crystallization temperature for a predetermined time interval, causing a temperature drop of the amorphous silicon so as to gradually drop, in a second time period, from the second crystallization temperature to the first crystallization temperature, allowing continuous temperature drop of the amorphous silicon to reach the room temperature to thereby obtain low-temperature poly-silicon. The differences of temperature among various areas can be reduced when amorphous silicon starts to crystallize so that the difference of crystal nuclei growth rate (Continued)

among the various areas can be reduced to greatly improve homogeneity of grains formed through solid phase crystallization.

9 Claims, 9 Drawing Sheets

(56) References Cited

U.S. PATENT DOCUMENTS

2006/0065186 A1* 3/2006 Kumoni .................. C30B 13/24
                                                                        117/92
2007/0065998 A1   3/2007 Lee et al.

FOREIGN PATENT DOCUMENTS

CN    107369613 A    11/2017
KR    10-2006-0040367 A    5/2006

* cited by examiner

SOLID PHASE CRYSTALLIZATION METHOD AND MANUFACTURING METHOD OF LOW-TEMPERATURE POLY-SILICON TFT SUBSTRATE

RELATED APPLICATIONS

The present application is a National Phase of International Application Number PCT/CN2018/076942, filed Feb. 22, 2018, and claims priority of China Application No. 201810065170.6, filed Jan. 23, 2018.

BACKGROUND OF THE INVENTION

1. Field of the Invention

The present invention relates to the field of display technology, and more particular to a solid phase crystallization method and a manufacturing method of a low-temperature poly-silicon thin-film transistor (TFT) substrate.

2. The Related Arts

Thin-film transistor (TFT) is the primary driver element for liquid crystal displays (LCDs) and active matrix organic light-emitting diode (AMOLED) display devices and is directly related to the direction of development of high performance flat panel display devices.

Low-temperature poly-silicon has attracted wide attention recently, due to high electron mobility, good sub-threshold swing, large ON/OFF state current, and low owe consumption, as well as being applicable to fabrication of high pixel density (pixels per inch, PPI) displays and also applicable to flexible organic light emitting diode (OLED) substrate. For the LCDs that are driven by voltage, the low-temperature poly-silicon TFT has a relatively high mobility so that it is possible to achieve driving liquid crystal molecules to rotate by using a TFT having a relatively small size to thereby reduce, to quite an extent, the space occupied by the TFT, increase light transmission area, and obtain higher brightness and resolution. For the AMOLED display devices that are driven by current, the low-temperature poly-silicon TFT could better suit the requirements for the driving current.

Figure 1:
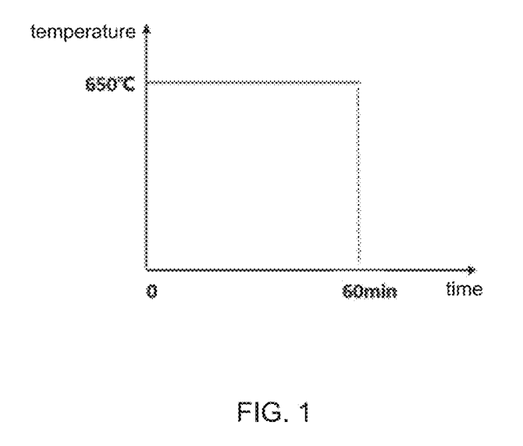
FIG. 1 is a curve demonstrating an annealing operation of a known solid phase crystallization (SPC) method.
Figure 2:
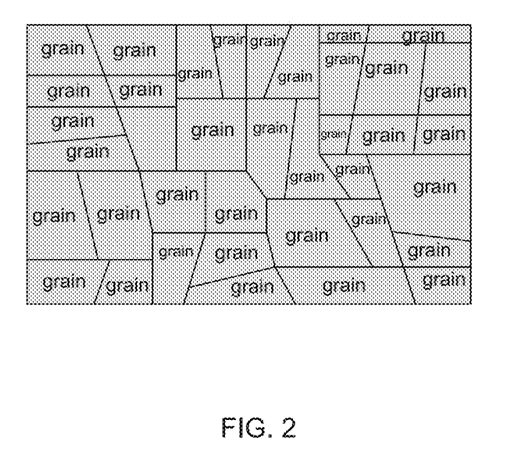
FIG. 2 is a schematic view illustrating grain morphology obtained with the known SPC method.

Heretofore, commonly known processes of crystallization of low-temperature poly-silicon includes excimer laser annealing (ELA) method and solid phase crystallization (SPC) method. ELA needs to be conducted with machines that are expensive so that the fabrication cost is high. In addition, grains formed with ELA crystallization have poor consistency and a TFT substrate manufactured therewith, when applied to a display device, may readily cause non-uniform display brightness (ELA scan mura), making it not possible for fabrication of large-sized displays. Compared to ELA crystallization method, SPC method has a relatively low fabrication cost. FIG. 1 illustrates a curve of annealing operation of the known SPC method. As shown in FIG. 1, the known SPC method provides continuous heating for 60 minutes, by directly placing amorphous silicon (a-Si) in a high temperature environment of around 650° C., to get crystallized. FIG. 2 is a schematic view illustrating grain morphology obtained with the known SPC method. As shown in FIG. 2, since the a-Si is directly placed in a high temperature environment, in an initial phase of crystallization, temperatures of the amorphous silicon in different areas vary greatly so the growth speeds of crystal nuclei in different areas show great difference, leading to the size of grains grown with SPC being different and showing poor consistency, and eventually causing great difference in respect of the characteristics of TFT devices, affecting product yield.

SUMMARY OF THE INVENTION

Objectives of the present invention are to provide a solid phase crystallization method, which reduces temperature difference among different areas at the beginning of crystallization of amorphous silicon so as to reduce the difference of crystal nuclei growth speed among different areas and thus greatly improve consistency of grains formed through solid phase crystallization.

Objectives of the present are also to provide a manufacturing method of a low-temperature poly-silicon thin-film transistor (TFT) substrate, which proceeds with crystallization of amorphous silicon by adopting the above solid phase crystallization method so as to improve consistency of poly-silicon grains to thereby greatly improve characteristics of a TFT device and increase product yield.

To achieve the above objectives, the present invention provides a solid phase crystallization method, which comprises: providing amorphous silicon; heating the amorphous silicon to a first crystallization temperature; continuously heating the amorphous silicon to cause a temperature rise, in a first time period, from the first crystallization temperature to a second crystallization temperature, keeping the amorphous silicon in the second crystallization temperature for a predetermined time interval, causing a temperature drop of the amorphous silicon so as to gradually drop, in a second time period, from the second crystallization temperature to the first crystallization temperature, allowing continuous temperature drop of the amorphous silicon to reach the room temperature to obtain low-temperature poly-silicon.

The first crystallization temperature is 380-420° C., and the second crystallization temperature is 630-670° C.

The first time period and the second time period are of the same period and are both 1 min to 10 min, and the time interval for keeping the amorphous silicon in the second crystallization temperature is 30 min to 120 min.

The first time period and the second time period are both 5 min, and the time interval for keeping the amorphous silicon in the second crystallization temperature is 60 min.

The temperature rise of the amorphous silicon is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature. The temperature increase rate and the temperature decrease rate are identical.

The present invention also provides a manufacturing method of a low-temperature poly-silicon TFT substrate, which comprises the following steps:

Step S1: providing a backing plate, depositing a buffer layer on the backing plate, depositing an amorphous silicon layer on the buffer layer to form a substrate-to-be-treated;

Step S2: applying a solid phase crystallization method to convert the amorphous silicon layer into a low-temperature poly-silicon layer, wherein the solid phase crystallization method comprises: heating the substrate-to-be-treated to a first crystallization temperature, continuously heating the substrate-to-be-treated to cause a temperature rise, in a first time period, from the first crystallization temperature to a second crystallization temperature, keeping the substrate-to-be-treated in the second crystallization temperature for a predetermined time interval, causing a temperature drop of the substrate-to-be-treated so as to gradually drop, in a second time period, from the second crystallization temperature to the first crystallization temperature, allowing continuous temperature drop of the substrate-to-be-treated to reach the room temperature;

Step S3: subjecting the low-temperature poly-silicon layer to patterning treatment to form an active layer; and depositing a gate insulation layer on the active layer and the buffer layer and forming a gate electrode on the gate insulation layer;

Step S4: applying a self-aligning operation to implant doping ions in two ends of the active layer by using the gate electrode as a mask so as to form a source contact area and a drain contact area and also a channel area that is between the source contact area and the drain contact area and located under and corresponding to the gate electrode;

Step S5: depositing an interlayer dielectric layer on the gate electrode and the gate insulation layer, subjecting the interlayer dielectric layer and the gate insulation layer to patterning treatment to form, in the interlayer dielectric layer and the gate insulation layer, a source contact hole and a drain contact hole that respectively correspond to the source contact area and the drain contact area of the active layer; and Step S6: forming a source electrode and a drain electrode on the interlayer dielectric layer, such that the source electrode and the drain electrode are respectively set in contact with the source contact area and the drain contact area of the active layer through the source contact hole and the drain contact hole.

The first crystallization temperature is 380-420° C., and the second crystallization temperature is 630-670° C.

The first time period and the second time period are of the same period and are both 1 min to 10 min, and the time interval for keeping the amorphous silicon in the second crystallization temperature is 30 min to 120 min.

The first time period and the second time period are both 5 min, and the time interval for keeping the amorphous silicon in the second crystallization temperature is 60 min.

The temperature rise of the amorphous silicon is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature. The temperature increase rate and the temperature decrease rate are identical.

The present invention further provides a solid phase crystallization method, which comprises: providing amorphous silicon; heating the amorphous silicon to a first crystallization temperature; continuously heating the amorphous silicon to cause a temperature rise, in a first time period, from the first crystallization temperature to a second crystallization temperature, keeping the amorphous silicon in the second crystallization temperature for a predetermined time interval, causing a temperature drop of the amorphous silicon so as to gradually drop, in a second time period, from the second crystallization temperature to the first crystallization temperature, allowing continuous temperature drop of the amorphous silicon to reach the room temperature to obtain low-temperature poly-silicon;

wherein the first crystallization temperature is 380-420° C., and the second crystallization temperature is 630-670° C.;

wherein the first time period and the second time period are both 5 min, and the time interval for keeping the amorphous silicon in the second crystallization temperature is 60 min; and wherein the temperature rise of the amorphous silicon is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature, the temperature increase rate and the temperature decrease rate being identical.

The efficacy of the present invention is that the present invention provides a solid phase crystallization method that allows the differences of temperature among various areas to be reduced when amorphous silicon starts to crystallize so that the difference of crystal nuclei growth rate among the various areas can be reduced to greatly improve homogeneity of grains formed through solid phase crystallization. The manufacturing method of a low-temperature poly-silicon TFT substrate according to the present invention adopts the above-described solid phase crystallization method for crystallization of amorphous silicon in order to improve grain consistency of poly-silicon to thereby greatly improve characteristics of a TFT device and help increase product yield.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Firstly, the present invention provides a solid phase crystallization method, which comprises: providing amorphous silicon; heating the amorphous silicon to a first crystallization temperature; continuously heating the amorphous silicon to cause a temperature rise, in a first time period, from the first crystallization temperature to a second crystallization temperature, keeping the amorphous silicon in the second crystallization temperature for a predetermined time interval, causing a temperature drop of the amorphous silicon so as to gradually drop, in a second time period, from the second crystallization temperature to the first crystallization temperature, allowing continuous temperature drop of the amorphous silicon to reach the room temperature to thereby obtain low-temperature poly-silicon.

Specifically, the first crystallization temperature is 380-420° C., and the second crystallization temperature is 630-670° C.

Preferably, the first crystallization temperature is 400° C., and the second crystallization temperature is 650° C.

Specifically, the first time period and the second time period are of the same period, both being 1 min to 10 min, and the time interval for keeping the amorphous silicon in the second crystallization temperature is 30 min to 120 min.

Preferably, the first time period and the second time period are both 5 min, and the time interval for keeping the amorphous silicon in the second crystallization temperature is 60 min.

Preferably, the temperature rise of the amorphous silicon is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature. The temperature increase rate and the temperature decrease rate are identical.

Figure 3:
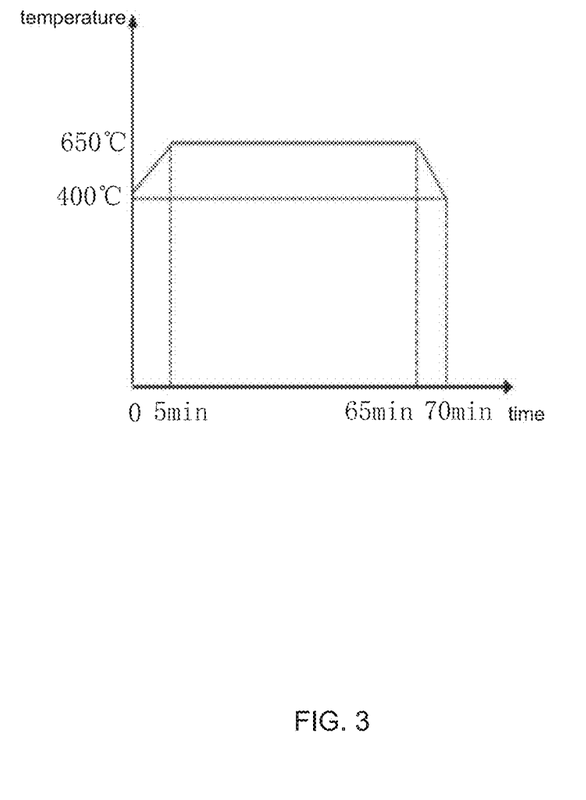
FIG. 3 is a curve demonstrating an annealing operation of a SPC method according to the present invention.
Figure 4:
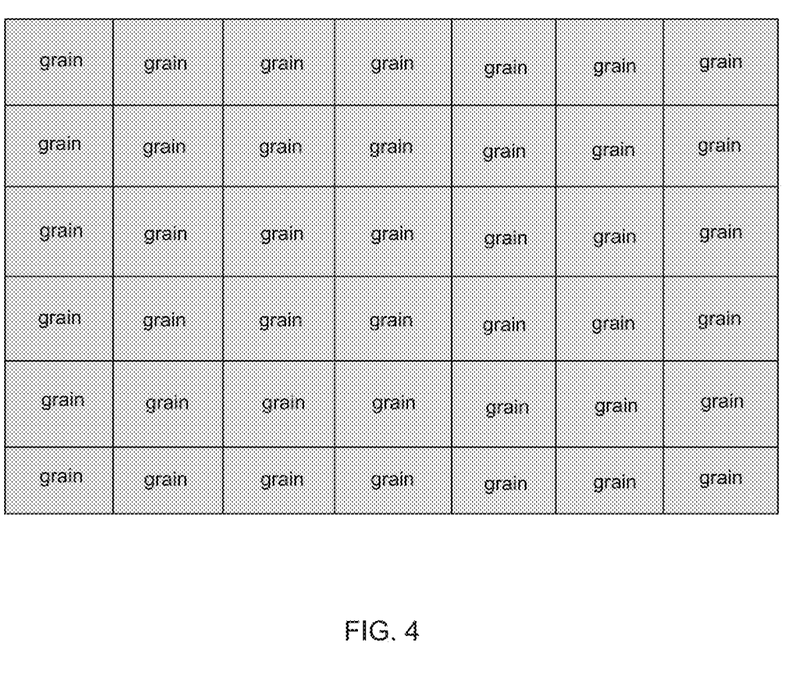
FIG. 4 is a schematic view illustrating grain morphology obtained with the SPC method according to the present invention.

As shown in FIG. 3, compared to the known solid phase crystallization method, the solid phase crystallization method of the present invention does not directly place amorphous silicon (a-Si) a high temperature of around 650° C. to heat for crystallization, and instead, the crystallization temperature begins with a first crystallization temperature (preferably 400° C.), followed by gradually temperature rising in the first time period (preferably 5 min) to the second crystallization temperature (preferably 650° C.), and then keeping in the second crystallization temperature (preferably 650° C.) for a predetermined time interval (preferably 60 min), followed by gradually temperature dropping, in the second time period (preferably 5 min), to the first crystallization temperature (preferably 400° C.). This allows the differences of temperature among various areas to be reduced when amorphous silicon starts to crystallize so that the difference of crystal nuclei growth rate among the various areas can be reduced to greatly improve homogeneity of grains formed through solid phase crystallization. As shown in FIG. 4, low-temperature poly-silicon manufactured with e solid phase crystallization method of the present invention shows excellent grain consistency. The low-temperature poly-silicon, when used in a TFT device, could significantly improve the characteristics of the TFT device and helps improve product yield.

Figure 5:
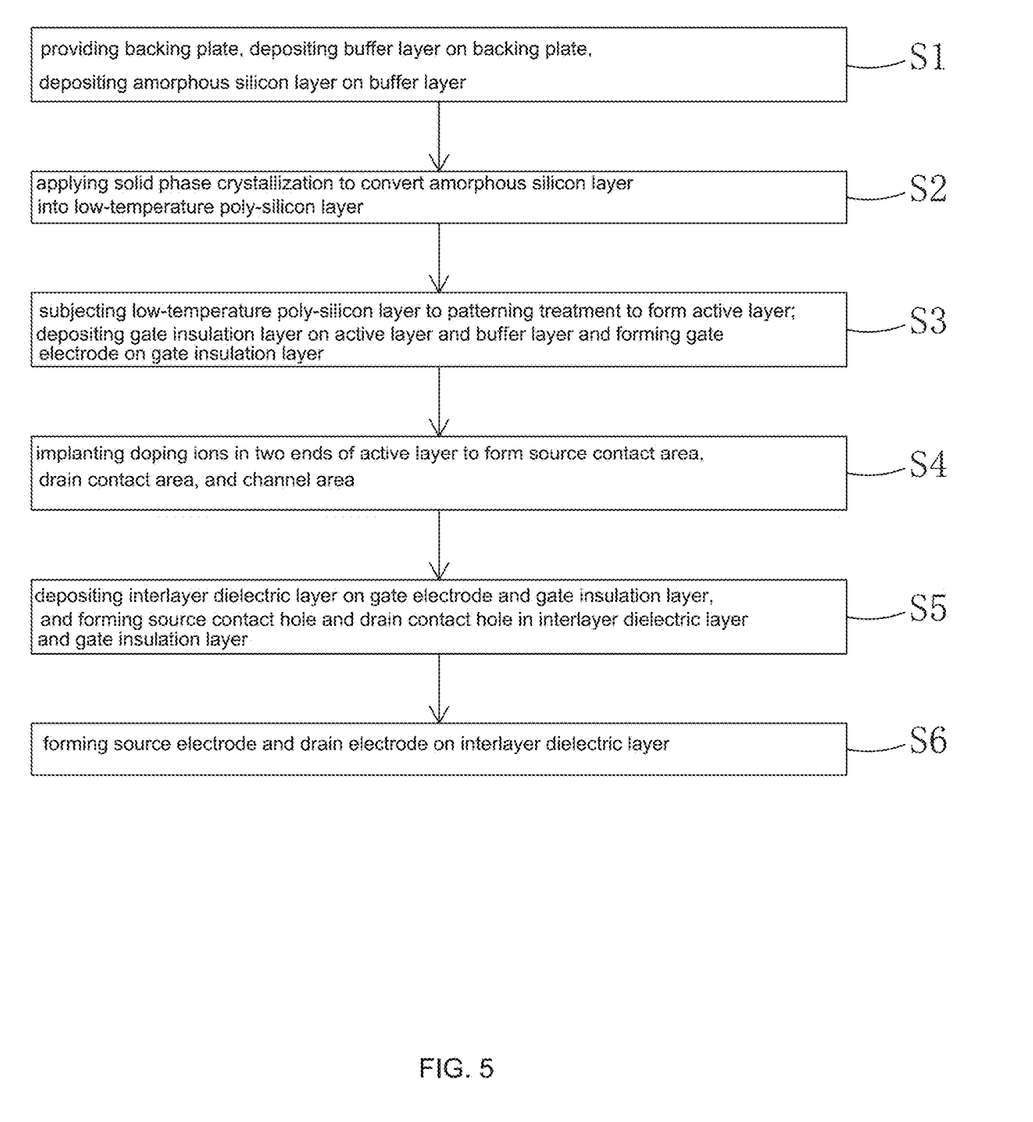
FIG. 5 is a flow chart illustrating a manufacturing method of a low-temperature poly-silicon TFT substrate according to the present invention.
Figure 6:
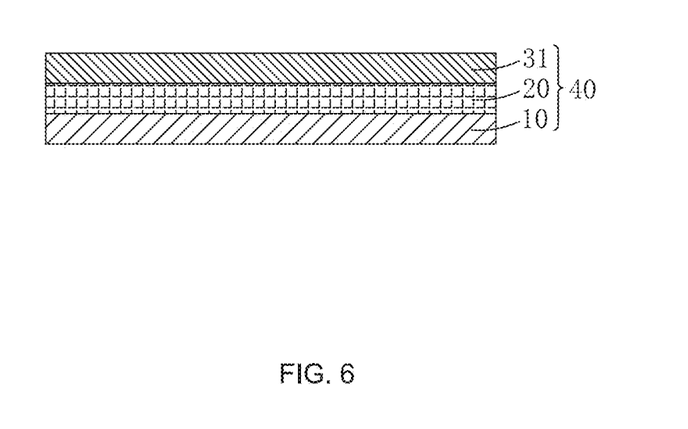
FIG. 6 is a schematic view illustrating Step S1 of the manufacturing method of a low-temperature poly-silicon TFT substrate according to the present invention.

Referring to FIG. 5, the present invention also provides a manufacturing method of a low-temperature poly-silicon TFT substrate, which adopts the above-described solid phase crystallization method to carry out crystallization of the amorphous silicon layer. The manufacturing method of a low-temperature poly-silicon TFT substrate comprises the followings steps:

Step S1: as shown in FIG. 6, providing a backing plate 10, depositing a buffer layer 20 on the backing plate 10, depositing an amorphous silicon layer 31 on the buffer layer 20 to form a substrate-to-be-treated 40.

Specifically, the backing plate 10 comprises a glass plate.

Specifically, Step S1 adopts plasma enhanced chemical vapor deposition (PECVD) to deposit the buffer layer 20 and the amorphous silicon layer 31.

Specifically, the buffer layer 20 comprises a silicon nitride ($SiN_x$) layered on the backing plate 10 and a silicon oxide ($SiO_x$) on the silicon nitride ($SiN_x$) layer.

Figure 7:
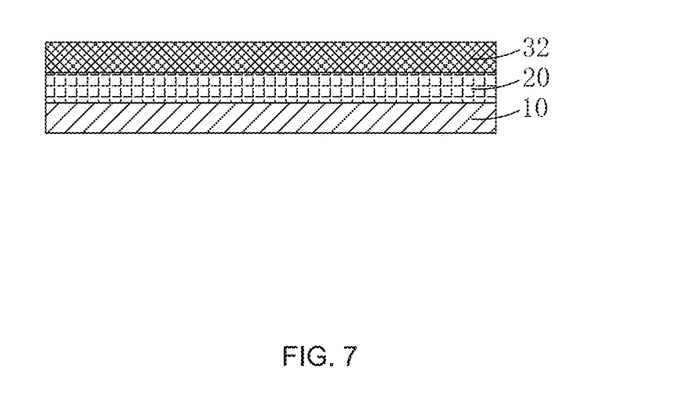
FIG. 7 is a schematic view illustrating Step S2 of the manufacturing method of a low-temperature poly-silicon TFT substrate according to the present invention.

Step S2: as shown in FIG. 7, applying a solid phase crystallization method to convert the amorphous silicon layer 31 into a low-temperature poly-silicon layer 32, wherein the solid phase crystallization method comprises: heating the substrate-to-be-treated 40 to a first crystallization temperature, continuously heating the substrate-to-be-treated 40 to cause a temperature rise, in a first time period, from the first crystallization temperature to a second crystallization temperature, keeping the substrate-to-be-treated 40 in the second crystallization temperature for a predetermined time interval, causing a temperature drop of the substrate-to-be-treated 40 so as to gradually drop, in a second time period, from the second crystallization temperature to the first crystallization temperature, allowing continuous temperature drop of the substrate-to-be-treated 40 to reach the room temperature.

Specifically, the first crystallization temperature is 380-420° C., and the second crystallization temperature is 630-670° C.

Preferably, the first crystallization temperature is 400° C., and the second crystallization temperature is 650° C.

Specifically, the first time period and the second time period are of the same period, both being 1 min to 10 min, and the time interval for keeping the substrate-to-be-treated 40 in the second crystallization temperature is 30 min to 120 min.

Preferably, the first time period and the second time period are both 5 min, and the time interval for keeping the substrate-to-be-treated 40 in the second crystallization temperature is 60 min.

Preferably, the temperature rise of the substrate-to-be-treated 40 is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature. The temperature increase rate and the temperature decrease rate are identical.

As shown in FIG. 3, compared to the known solid phase crystallization method, the solid phase crystallization method adopted in Step S2 does not directly place amorphous silicon (a-Si) in a high temperature of around 650° C. to heat for crystallization, and instead, the crystallization temperature begins with a first crystallization temperature (preferably 400° C.), followed by gradually temperature rising in the first time period (preferably 5 min) to the second crystallization temperature (preferably 650° C.), and then keeping in the second crystallization temperature (preferably 650° C.) for a predetermined time interval (preferably 60 min), followed by gradually temperature dropping, in the second time period (preferably 5 min), to the first crystallization temperature (preferably 400° C.). This allows the differences of temperature among various areas to be reduced when the amorphous silicon layer 31 starts to crystallize so that the difference of crystal nuclei growth rate among the various areas can be reduced to greatly improve homogeneity of grains formed through solid phase crystallization. As shown in FIG. 4, low-temperature poly-silicon manufactured with the solid phase crystallization method adopted in Step S2 shows excellent grain consistency and may significantly improve the characteristics of a TFT device and helps improve product yield.

Figure 8:
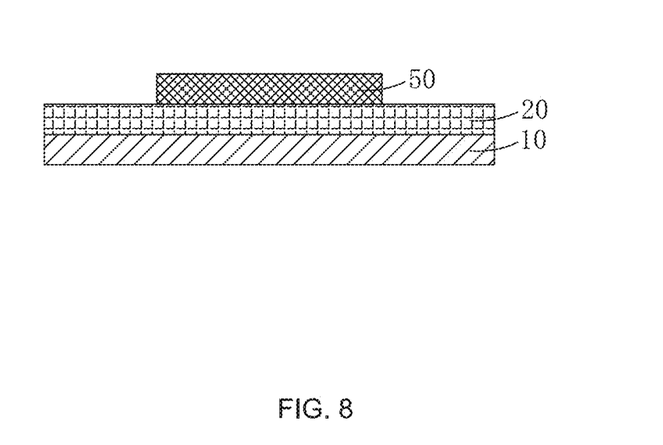
FIGS. 8-9 are schematic views illustrating Step S3 of the manufacturing method of a low-temperature poly-silicon TFT substrate according to the present invention.
Figure 9:
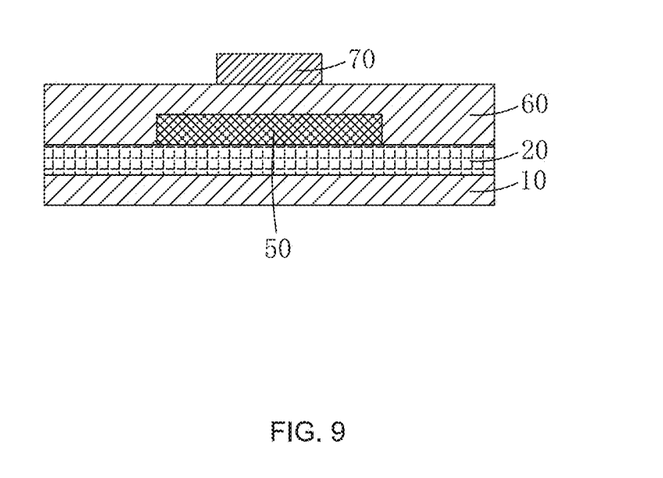

Step S3: as shown in FIGS. 8 and 9, subjecting the low-temperature poly-silicon layer 32 to patterning treatment to form an active layer 50, depositing a gate insulation layer 60 on the active layer 50 and the buffer layer 20, forming a gate electrode 70 on the gate insulation layer 60.

Specifically, the gate insulation layer 60 comprises a silicon oxide $SiO_x$) layer.

Specifically, in Step S3, a process for manufacturing the gate electrode 70 comprises: applying physical vapor deposition (PVD) to deposit a gate metal layer on the gate insulation layer 60 and subjecting the gate metal layer to patterning treatment to form the gate electrode 70.

Specifically, the e gate electrode 70 is formed of a material comprising metallic molybdenum (Mo).

Figure 10:
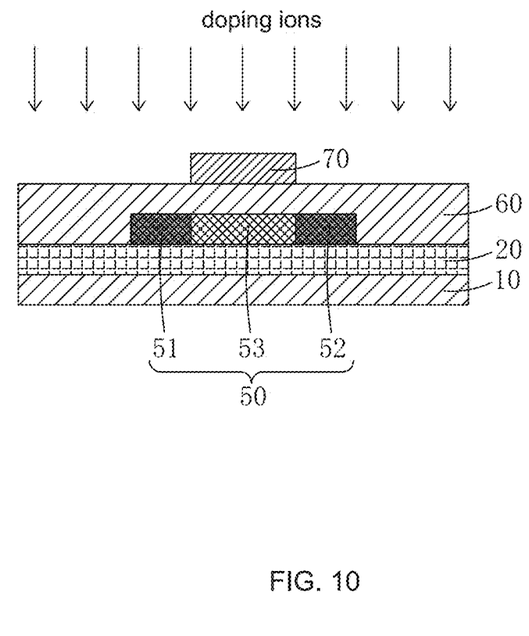
FIG. 10 is a schematic view illustrating Step S4 of the manufacturing method of a low-temperature poly-silicon TFT substrate according to the present invention.

Step S4: as shown in FIG. 10, applying a self-aligning operation to implant doping ions in two ends of the active layer 50 by using the gate electrode 70 as a mask so as to form a source contact area 51 and a drain contact area 52, and also a channel area that is between the source contact area 51 and the drain contact area 52 and located under and corresponding to the gate electrode 70.

Specifically, the doping ions are P-type ions. The P-type ions are preferably boron ions.

Figure 11:
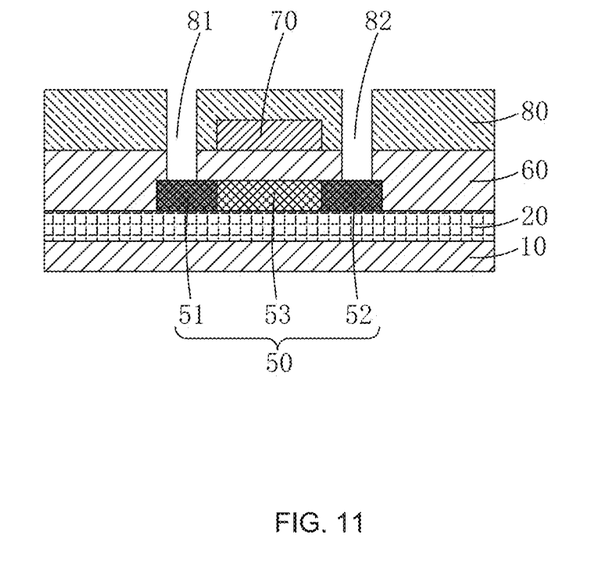
FIG. 11 is a schematic view illustrating Step S5 of the manufacturing method of a low-temperature poly-silicon TFT substrate according to the present invention.

Step S5: as shown in FIG. 11, depositing an interlayer dielectric layer 80 on the gate electrode 70 and the gate insulation layer 60, subjecting the interlayer dielectric layer 80 and the gate insulation layer 60 to patterning treatment to form, in the interlayer dielectric layer 80 and the gate insulation layer 60, a source contact hole 81 and a drain contact hole 82 that respectively correspond to the source contact area 51 and the drain contact area 52 of the active layer 50.

Specifically, Step S5 adopts PECVD to deposit the interlayer dielectric layer 80 on the gate electrode 70 and the gate insulation layer 60.

Specifically, the interlayer dielectric layer 80 comprises a silicon oxide ($SiO_x$) layer on the gate electrode 70 and the gate insulation layer 60 and a silicon nitride ($SiN_x$) layer on the silicon oxide ($SiO_x$) layer.

Preferably, Step S5 further comprises, before subjecting the interlayer dielectric layer 80 to patterning treatment, conducting rapid thermal annealing to an entire substrate to which the interlayer dielectric layer 80 is attached in order to activate the active layer 50, allowing boron ions contained in the source contact area 51 and the drain contact area 52 to form covalent bond with poly-silicon in order to reduce detects of poly-silicon and reduce contact resistance between subsequently formed source and drain electrodes 91, 92 and the active layer 50 and improve effect of electrical connection and also to allow hydrogen contained in silicon nitride ($SiN_x$) layer of the interlayer dielectric layer 80 to spread to the active layer 50 to supplement hydrogen to the poly-silicon to further reduce defects of the poly-silicon and thus better stabilizing the operation of the TFT.

Figure 12:
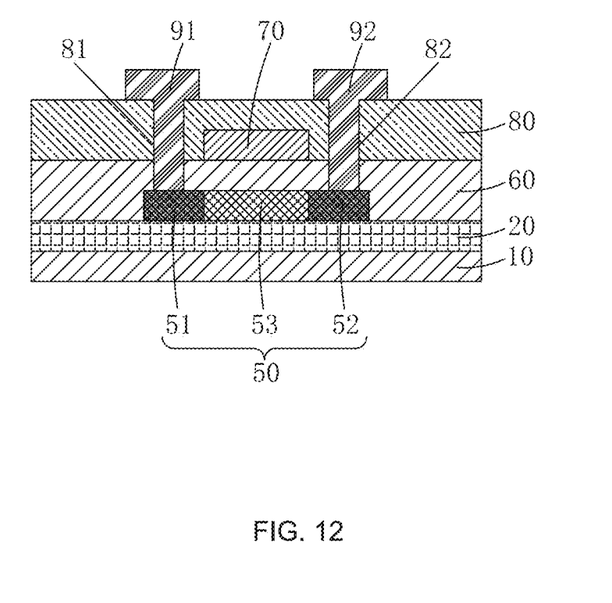
FIG. 12 is a schematic view illustrating Step S6 of the manufacturing method of a low-temperature poly-silicon TFT substrate according to the present invention.

Step S6: as shown in FIG. 12, forming a source electrode 91 and a drain electrode 92 on the interlayer dielectric layer 80, such that the source electrode 91 and the drain electrode 92 are respectively set in contact with the source contact area 51 and the drain contact area 52 of the active layer 50 through the source contact hole 81 and the drain contact hole 82.

Specifically, in Step S6, a process for manufacturing the source electrode 91 and the drain electrode 92 comprises: applying PVD to deposit a source-drain metal layer on the interlayer dielectric layer 80 and subjecting the source-drain metal layer to patterning treatment to form the source electrode 91 and the drain electrode 92.

Specifically, the source electrode 91 and the drain electrode 92 each comprise two first structural layers and a second structural layer interposed between the two first structural layers. The first structural layers are formed of a material comprising molybdenum (Mo), and the second structural layer is formed of a material comprising aluminum (Al).

In summary, the present invention provides a solid phase crystallization method and a manufacturing method of a low-temperature poly-silicon TFT substrate. The solid phase crystallization method of the present invention comprises: providing amorphous silicon; heating the amorphous silicon to a first crystallization temperature; continuously heating the amorphous silicon to cause a temperature rise, in a first time period, from the first crystallization temperature to a second crystallization temperature, keeping the amorphous silicon in the second crystallization temperature for a predetermined time interval, causing a temperature drop of the amorphous silicon so as to gradually drop, in a second time period, from the second crystallization temperature to the first crystallization temperature, allowing continuous temperature drop of the amorphous silicon to reach the room temperature to thereby obtain low-temperature poly-silicon. The solid phase crystallization method allows the differences of temperature among various areas to be reduced when amorphous silicon starts to crystallize so that the difference of crystal nuclei growth rate among the various areas can be reduced to greatly improve homogeneity of grains formed through solid phase crystallization. The manufacturing method of a low-temperature poly-silicon TFT substrate according to the present invention adopts the above-described solid phase crystallization method for crystallization of amorphous silicon in order to improve grain consistency of poly-silicon to thereby greatly improve characteristics of a TFT device and help increase product yield.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A solid phase crystallization method, comprising: providing amorphous silicon; heating the amorphous silicon to a first crystallization temperature; continuously heating the amorphous silicon to cause a temperature rise, in a first time period, from the first crystallization temperature to a second crystallization temperature, keeping the amorphous silicon in the second crystallization temperature for a predetermined time interval, causing a temperature drop of the amorphous silicon so as to gradually drop, in a second time period, from the second crystallization temperature to the first crystallization temperature, allowing continuous temperature drop of the amorphous silicon to reach the room temperature to obtain low-temperature poly-silicon;

wherein the first crystallization temperature is 380-420° C., and the second crystallization temperature is 630-670° C.; and wherein the first time period ranges from 1 min to 10 min, such that, in the first time period, the amorphous silicon is heated from a low temperature of 380-420° C. to a high temperature of 630-670° C. in a time period ranging from 1 min to 10 min.

2. The solid phase crystallization method according to claim 1, wherein the second time period ranges from 1 min to 10 min, and the time interval for keeping the amorphous silicon in the second crystallization temperature is 30 min to 120 min.

3. The solid phase crystallization method according to claim 2, wherein the first time period and the second time period are both 5 min, and the time interval for keeping the amorphous silicon in the second crystallization temperature is 60 min.

4. The solid phase crystallization method according to claim 1, wherein the temperature rise of the amorphous silicon is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature, the temperature increase rate and the temperature decrease rate being identical.

5. A manufacturing method of a low-temperature poly-silicon thin-film transistor (TFT) substrate, comprising the following steps:

Step S1: providing a backing plate, depositing a buffer layer on the backing plate, depositing an amorphous silicon layer on the buffer layer to form a substrate-to-be-treated;

Step S2: applying a solid phase crystallization method to convert the amorphous silicon layer into a low-temperature poly-silicon layer, wherein the solid phase crystallization method comprises: heating the substrate-to-be-treated to a first crystallization temperature, continuously heating the substrate-to-be-treated to cause a temperature rise, in a first time period, from the first crystallization temperature to a second crystallization temperature, keeping the substrate-to-be-treated in the second crystallization temperature for a predetermined time interval, causing a temperature drop of the substrate-to-be-treated so as to gradually drop, in a second time period, from the second crystallization temperature to the first crystallization temperature, allowing continuous temperature drop of the substrate-to-be-treated to reach the room temperature;

wherein the first crystallization temperature is 380-420° C., and the second crystallization temperature is 630-670° C.; and wherein the first time period ranges from 1 min to 10 min, such that, in the first time period, the amorphous silicon that is included in the substrate-to-be-treated is heated from a low temperature of 380-420° C. to a high temperature of 630-670° C. in a time period ranging from 1 min to 10 min;

Step S3: subjecting the low-temperature poly-silicon layer to patterning treatment to form an active layer; and depositing a gate insulation layer on the active layer and the buffer layer and forming a gate electrode on the gate insulation layer;

Step S4: applying a self-aligning operation to implant doping ions in two ends of the active layer by using the gate electrode as a mask so as to form a source contact area and a drain contact area, and also a channel area that is between the source contact area and the drain contact area and located under and corresponding to the gate electrode;

Step S5: depositing an interlayer dielectric layer on the gate electrode and the gate insulation layer, subjecting the interlayer dielectric layer and the gate insulation layer to patterning treatment to form, in the interlayer dielectric layer and the gate insulation layer, a source contact hole and a drain contact hole that respectively correspond to the source contact area and the drain contact area of the active layer; and Step S6: forming a source electrode and a drain electrode on the interlayer dielectric layer, such that the source electrode and the drain electrode are respectively set in contact with the source contact area and the drain contact area of the active layer through the source contact hole and the drain contact hole.

6. The manufacturing method of a low-temperature poly-silicon TFT substrate according to claim 5, wherein the second time period ranges from 1 min to 10 min, and the time interval for keeping the amorphous silicon in the second crystallization temperature is 30 min to 120 min.

7. The manufacturing method of a low-temperature poly-silicon TFT substrate according to claim 6, wherein the first time period and the second time period are both 5 min, and the time interval for keeping the amorphous silicon in the second crystallization temperature is 60 min.

8. The manufacturing method of a low-temperature poly-silicon TFT substrate according to claim 5, wherein the temperature rise of the amorphous silicon is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature, the temperature increase rate and the temperature decrease rate being identical.

9. A solid phase crystallization method, comprising: providing amorphous silicon; heating the amorphous silicon to a first crystallization temperature; continuously heating the amorphous silicon to cause a temperature rise, in a first time period, from the first crystallization temperature to a second crystallization temperature, keeping the amorphous silicon in the second crystallization temperature for a predetermined time interval, causing a temperature drop of the amorphous silicon so as to gradually drop, in a second time period, from the second crystallization temperature to the first crystallization temperature, allowing continuous temperature drop of the amorphous silicon to reach the room temperature to obtain low-temperature poly-silicon;

wherein the first crystallization temperature is 380-420° C., and the second crystallization temperature is 630-670° C.; and wherein the first time period is 5 min, such that, in the first time period, the amorphous silicon is heated from a low temperature of 380-420° C. to a high temperature of 630-670° C. in a time period of 5 min;

wherein the second time period is 5 min, and the time interval for keeping the amorphous silicon in the second crystallization temperature is 60 min; and wherein the temperature rise of the amorphous silicon is carried out by following a constant temperature increase rate to gradually rise from the first crystallization temperature to the second crystallization temperature and the temperature drop is carried out by following a constant temperature decrease rate to gradually drop from the second crystallization temperature to the first crystallization temperature, the temperature increase rate and the temperature decrease rate being identical.

* * * * *